United States Patent [19]

Brodsky et al.

[11] Patent Number: 4,902,234

[45] Date of Patent: Feb. 20, 1990

[54] ELECTRICAL CONNECTOR ASSEMBLY INCLUDING PRESSURE EXERTION MEMBER

[75] Inventors: William L. Brodsky, Binghamton; Wesley J. Buyck, Owego; Alan D. Knight, Newark Valley, all of N.Y.

[73] Assignee: International Business Machines Corporation, Armonk, N.Y.

[21] Appl. No.: 266,538

[22] Filed: Nov. 3, 1988

[51] Int. Cl.⁴ .............................................. H01R 9/09
[52] U.S. Cl. ......................................... 439/67; 439/74
[58] Field of Search ...................... 439/66, 67, 68, 70, 439/71, 74, 75, 493, 494, 495, 77, 492

[56] References Cited

U.S. PATENT DOCUMENTS

| | | | |
|---|---|---|---|
| 3,861,135 | 1/1975 | Seeger, Jr. et al. | 58/50 |
| 3,883,213 | 5/1975 | Glaister | 439/66 |
| 3,971,610 | 7/1976 | Buchoff et al. | 439/75 |
| 4,018,496 | 4/1977 | Bilsback | 439/67 |
| 4,029,999 | 6/1977 | Neumann et al. | 361/386 |
| 4,064,623 | 12/1977 | Moore | 29/629 |
| 4,116,516 | 9/1978 | Griffin | 439/67 |
| 4,184,729 | 1/1980 | Parks et al. | 439/66 |
| 4,329,732 | 5/1982 | Kavli et al. | 361/283 |
| 4,538,865 | 9/1985 | Wakabayashi et al. | 439/66 |
| 4,587,596 | 5/1986 | Bunnell | 439/493 X |
| 4,647,125 | 3/1987 | Landi | 439/67 |
| 4,768,971 | 9/1988 | Simpson | 439/67 X |
| 4,787,854 | 11/1988 | Parquier | 439/67 |

FOREIGN PATENT DOCUMENTS

| | | | |
|---|---|---|---|
| 55640 | 7/1982 | European Pat. Off. | 439/66 |
| 700490 | 12/1953 | Fed. Rep. of Germany | 439/67 |
| 1488226 | 1/1976 | United Kingdom . | |

OTHER PUBLICATIONS

Elect. Connection for Flat Flex. Cable, Knight et al., IBM Disclosure Bulletin, vol. 25, No. 1, Jun. 1982, 439-67.
Vol. 18, No. 2 (7/75), p. 340, IBM Technical Disclosure Bulletin.
Vol. 22, No. 2 (7/79), pp. 444, 445, IBM Technical Disclosure Bulletin.
Vol. 25, No. 7A (12/82), pp. 3438-3441, IBM Technical Disclosure Bulletin.
Vol. 26, No. 12 (5/84), p. 6657, IBM Technical Disclosure Bulletin.
Dow Corning Bulletin 17-047 (7/71), "Information About Silastic Silicone Rubber".

Primary Examiner—William Briggs
Attorney, Agent, or Firm—Lawrence R. Fraley

[57] ABSTRACT

An electrical connector assembly for connecting two circuit members (e.g., printed circuit board, flexible cable) each including a plurality of electrical connectors thereon. The assembly includes a pressure exertion member having a substantially rigid (e.g., metallic) base plate, a plurality of compressible, silicone rubber elements attached to one surface of the base plate to provide the desired pressure when compressed, and a resilient member attached to an opposing side of the base plate such that compensation is provided for surface elevation variations in the first and/or second circuit members upon compression of the exertion member. The assembly includes a means (e.g., clamp) for retaining the invention's exertion member against one (e.g., the second) of the circuit members in final assembly. The invention is able to provide sound electrical connection over prolonged periods of time and during exposure to relatively harsh environmental conditions (e.g., high heat and moisture).

20 Claims, 3 Drawing Sheets

ELECTRICAL CONNECTOR ASSEMBLY INCLUDING PRESSURE EXERTION MEMBER

TECHNICAL FIELD

The invention relates to electrical assemblies and particularly to such assemblies wherein at least two circuits are electrically connected. Even more particularly, the invention relates to such assemblies wherein external pressure is applied to one or both of the circuit components (e.g., printed circuit, flexible cable) to effect the connection.

BACKGROUND OF THE INVENTION

Utilization of electrical connector assemblies for the purpose of electrically coupling various circuit devices is, of course, well known, with several examples being shown and described in the following patents and publications:

U.S. Pat. No. 3,861,135- R. E. Seeger, Jr. et al.
U.S. Pat. No. 3,883,213- F. J. Glaister
U.S. Pat. No. 3,971,610- L. S. Buchoff et al.
U.S. Pat. No. 4,184,729- H. L. Parks et al.
IBM Technical Disclosure Bulletins:
Vol. 18, No. 2 (7/75), p. 340
Vol. 22, No. 2 (7/79), pp. 444,445
Vol. 25, No. 7A (12/82), pp. 3438-3441

In the design of connector assemblies wherein direct contact is desired between the individual electrical conductors (e.g., printed circuit lines, contact pins, etc.) which constitute part of the circuit devices being coupled, as in the case of the instant invention, application of a reliable contact pressure of sufficient duration and capable of withstanding possibly adverse environmental conditions (e.g., heat, moisture) is considered essential. Excessive pressure can result in damage to various components of the assembly (particularly the conductors) during both assembly and/or operation. Additionally, the provision of such pressure has heretofore typically been accomplished through the utilization of relatively large components (e.g., connector housings) needed to produce these assemblies, thus also adding unnecessarily to the cost thereof. In those assemblies subjected to adverse environmental conditions such as mentioned above, failure to withstand same has also resulted in such problems as contact corrosion, reduced contact pressure, increased maintenance costs, etc.

As will be defined hereinbelow, the connector assembly of the invention provides a sound, reliable contact pressure of relatively low magnitude through the utilization of effective materials which are relatively inexpensive and which can withstand adverse environmental conditions such as excessive heat and moisture. It is believed that such a connector assembly would constitute a significant advancement in the art.

DISCLOSURE OF THE INVENTION

It is a primary object of the invention to enhance the art of electrical connector assemblies.

It is another object of the invention to provide an electrical connector assembly which provides a sound, effective contact pressure in a reliable manner.

It is yet another object of the invention to provide such a connector assembly which is operable in relatively adverse environmental conditions such a high heat and moisture.

It is a still further object of the invention to provide a connector assembly possessing, among others, the several features described herein and yet which can be produced on a relatively large scale (e.g., mass production), thus reducing the overall cost thereof in comparison to many known connector assemblies of the prior art.

These and other objects are achieved according to one aspect of the invention through the provision of an electrical connector assembly comprising a first circuit member having a plurality of electrical conductors thereon, a second circuit member also having a plurality of electrical conductors thereon, a pressure exertion member for exerting a predetermined pressure against the second circuit member to thereby cause electrical contact between respective conductors of the two circuit members, and means for retaining the pressure exertion member against the second circuit member to cause exertion of said force. The pressure exertion member includes a substantially rigid base plate, a plurality of compressible elements located on a first side of the base plate to provide the desired contact force when compressed, and a resilient member located on a second side of the base plate for compensating for variations in the surface elevations of the first and/or second circuit members (e.g., the conductors thereon).

In accordance with another aspect of the invention there is provided an electrical connector assembly including similar components as the aforementioned assembly except that the assembly's second circuit member includes but a singular conductor (e.g., a ground path) and the corresponding pressure exertion member thus serves to exert its pressure such that this singular conductor effects contact with the defined plurality of conductors of the first member.

BEST MODE FOR CARRYING OUT THE INVENTION

For a better understanding of the invention, together with other objects, advantages and capabilities thereof, reference is made to the following disclosure in connection with the aforementioned drawings.

Figure 1:
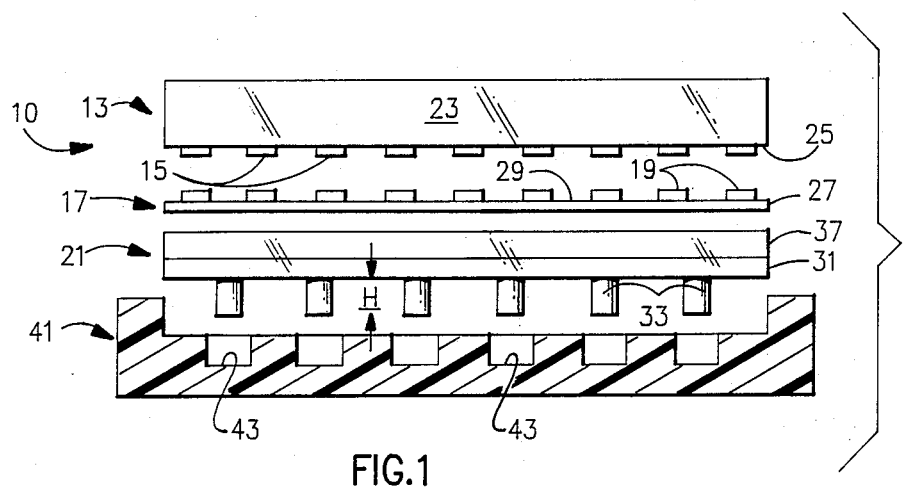
FIG. 1 is a side elevational view, in exploded format, of an electrical connector assembly in accordance with one embodiment of the invention, excluding the defined means for retaining the pressure exertion member against the invention's second circuit member (said assembly including the pressure exertion and housing members of FIGS. 3 and 4, respectively)
Figure 2:
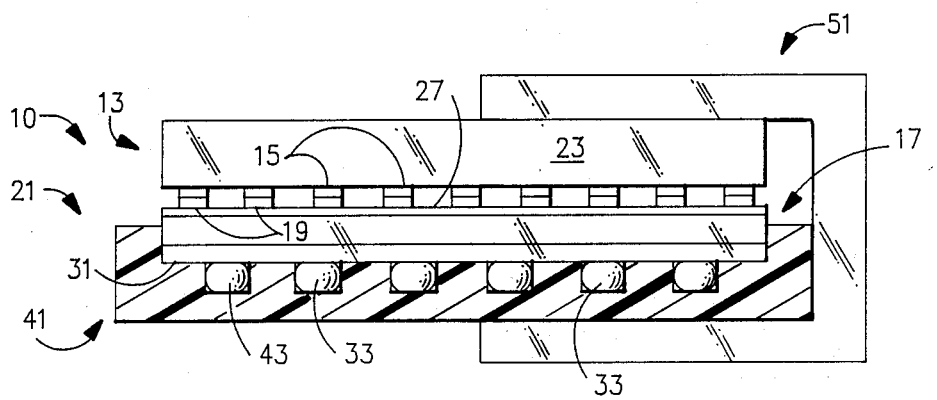
FIG. 2 is a side elevational view of the assembly of FIG. 1, as assembled, further including the aforementioned retaining means.

In FIG. 1, there is shown an electrical connector assembly 10 in accordance with a preferred embodiment of the invention, excluding the defined means for retaining the assembly in compression. This means is illustrated in FIG. 2 and will be further described hereinbelow. Assembly 10 includes a first circuit member 13 with a plurality of electrical conductors 15 thereon, a second circuit member 17 including a plurality of conductors 19 thereon, and a pressure (or force) exertion member 21 for providing a predetermined pressure (or force) of relatively low magnitude against one of the circuit members (in FIG. 1, circuit member 17) sufficient to cause the respective conductors 15 and 19 of circuit members 13 and 17, respectively, to contact each other in a sound, effective manner. As understood herein, member 21 assures a sound electrical connection between each of the respective conductors while at the same time uniquely compensating for surface elevation variations in either/both of the circuit members 13 and 17. Specifically, the invention assures sound connection between the conductors thereof despite differences in thickness or such conductors and/or the substrate upon which these are positioned. As further understood, the invention is able to provide this predetermined pressure over a relatively prolonged period of time, despite deleterious conditions such as relatively high heat and/or moisture to which the invention may be subjected.

Figure 7:
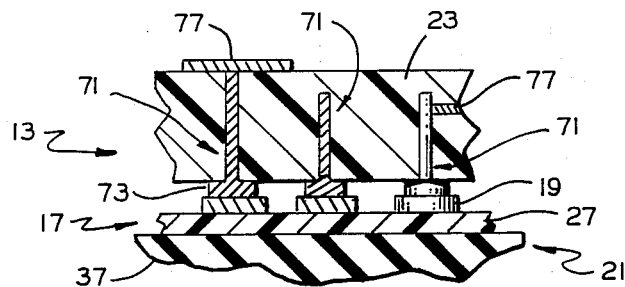
FIG. 7 is a partial view, in section, illustrating an alternate form of conductors for use with the invention's first (or second) circuit member.

In a preferred embodiment, first circuit member 13 comprises a printed circuit board having a relatively rigid insulative substrate 23. Substrate 23 is preferably of a known material (e.g., epoxy) and includes the defined conductors 15 located along a first surface 23 thereof. Each conductor 15, as shown, is preferably of flat configuration and comprised of a sound metallic conductive material (e.g., copper). Each conductor 15 is positioned on the epoxy substrate 23 using techniques known in the printed circuit art and further description is thus not believed necessary. In one example of the invention, substrate 23 possessed a thickness of about 0.062 inch while each of the copper conductive members 15 possessed an average thickness of about 0.001 inch. As defined, each conductor 15 is substantially flat in configuration and thus constitutes a "metallic pad" to which connection is made. As defined below, such a configuration (flat) is also preferred for the conductors 19 of the invention's second circuit member. Accordingly, the invention provides for sound connection between opposing, relatively flat metallic conductors in the manner depicted herein. It is understood, however, that alternative designs for the described conductors (15, 19) may be utilized, with one such example being a conductive pin (e.g., as shown in FIG. 7 and described hereinbelow).

Circuit member 17 preferably comprises a flexible substrate 27 having the described conductors 19 located on an upper surface 29 thereof. As stated, conductors 19 are also preferably of substantially flat configuration and, in one embodiment of the invention were comprised of copper and deposited on substrate 27 using known printed circuit technology. The corresponding flexible substrate in this example was comprised of electrically insulative material (polyimide) and possessed a thickness within the range of about 0.002 inch to about 0.005 inch, thus assuring the flexibility desired for this component.

Figure 3:
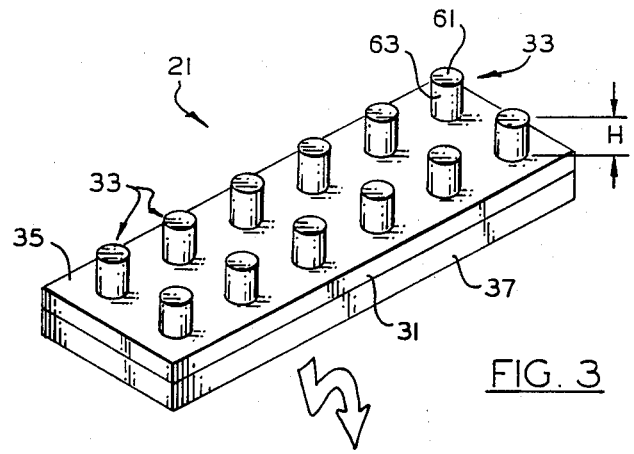
FIG. 3 is a front perspective view of a pressure exertion member in accordance with one embodiment of the invention.

As stated, connector assembly 10 further includes the aforementioned pressure (or force) exertion member 21 which, as shown in the orientation depicted in FIG. 1, is located substantially below the flexible circuit 17 and, in accordance with a preferred embodiment of the invention, is designed for physically engaging circuit 17 to force it uniformly against the rigid first circuit member 13 when assembly 10 is fully assembled (FIG. 2). Member 21, as also shown in FIG. 3 (the member in FIG. 3 being inverted for illustrative purposes), includes a substantially rigid base plate 31, a plurality of compressible elements 33 located on a first side 35 of plate 31, and a resilient member 37 located substantially on the opposite side of base 31 from element 33. In a preferred embodiment, rigid base plate 31 was comprised of aluminum and possessed a thickness of about 0.050 inch. Being metallic and of such thickness, plate 31 thus provides the substantial rigidity needed for the invention, but is also uniquely capable of slight bowing (or bending) during operation thereof. Specifically, plate 31 functions to provided distribution thereacross of the individual pressures exerted by each of the compressible elements 33 when said elements are compressed (as in FIG. 2) to exert a combined, uniform pressure against the flexible circuit 17. During this compression, resilient member 37 functions to compensate for any variations in surface elevations for the described circuit members 13 and/or 17.

Figure 6:
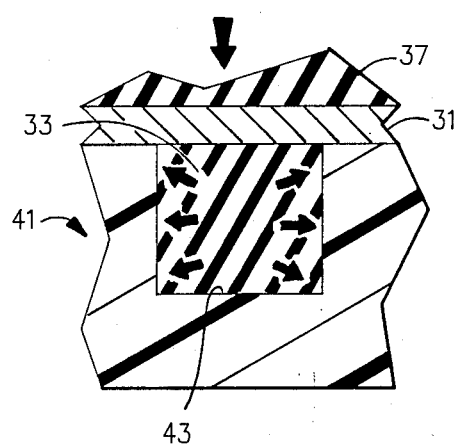
FIG. 6 is a partial view, in section, illustrating the expansion of one of the compressible elements of the invention during compression thereof.
Figure 4:
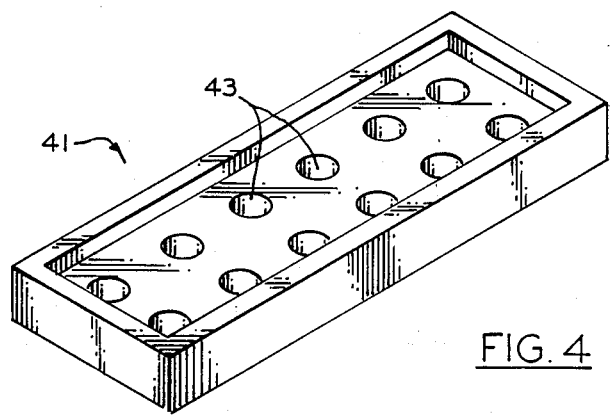
FIG. 4 is a perspective view of a housing member which may be utilized with the pressure exertion member illustrated in FIG. 3.

In a preferred embodiment of the invention, assembly 10 also includes an electrically insulative (e.g., plastic) housing 41 (see also FIG. 4) designed for accommodating member 21. As shown, housing 41 includes a plurality of apertures 43 therein each designed for having a respective one of compressible elements 33 positioned therein. Member 21, as illustrated in FIG. 3, is inverted (see arrow) to achieve this positioning. In non-compressed form (prior to such positioning), each of the compressible elements 33 is shown as being substantially smaller than the corresponding aperture 43 into which it will be positioned, thus allowing for necessary expansion (FIG. 6) of each such element during assembly. Such expansion is also illustrated in the sectional view of FIG. 2. With particular attention to FIG. 6, this outward expansion results in a substantially total occupation of a respective aperture 43 by the respective element.

Assembly of the invention (and resulting compression of elements 33 to provide the exertion pressures necessary) can be accomplished using any of several techniques, with one representative example being a clamping member 51 (FIG. 2) designed for specifically engaging the outer surfaces of the rigid circuit member 13 and housing 41. Clamp 51 thus serves to contain the first and second circuit members, the compressed exertion member and the insulative housing therebetween. As stated, clamp 51 is only representative of one of several methods for containing the aforementioned four elements. Other techniques, including simple placement of first circuit member 13 upon a surface within a suitable housing or the like and application of a downward or similar pressure or force against the outer surface of housing 41, are readily possible using the teachings of the invention and the invention is thus not limited to the example illustrated. Further description is thus not believed necessary.

As shown in the drawings, each of the compressible elements 33 is of a cylindrical configuration. As understood herein, the shape and selection of material for each such element constitute significant aspects of the invention in order to attain the results defined herein. Using a cylindrical configuration, a resulting shape factor is defined as the ratio of the area of one loaded surface (i.e., 61 in FIG. 3) to the element's free surface area (that not subjected to load). In the embodiment represented in FIG. 3, the area of the cylindrical sides of each element represents the free surface area, the load being applied to surface 61. Shape factor is considered significant in that a higher shape factor will result in exertion of higher reactive forces under equivalent compression. In a preferred embodiment, each of the compressible elements 33 possessed an overall height (H in FIG. 3) within the range from about 0.100 inch to about 0.400 inch and an outer diameter of about 0.250 inch. In one example, compression of a total number of four elements 33 to an extent of about fifteen percent to about thirty-five percent of the original height thereof resulted in a combined pressure from exertion member 21 within the range of from about ten to about thirty pounds per square inch (PSI). In a specific example, a total of eighty-eight conductors 19 on flexible circuit 17 was utilized to contact a respective, similar number of conductors on the rigid circuit member 13. In this example, each of twelve elements 33 were compressed about twenty-four percent of its original height and the resulting combined pressure was about forty-four PSI on conductors 19. It is understood that the number of compressible elements 33 required to produce the desired exertion pressure is substantially less than the corresponding number of contacts on each of the described circuit members. It was also determined, from testing and using the shape factors and particular material defined herein, that optimum performance was attained at about twenty percent to thirty percent compression of elements 33, although these elements, as stated, are capable of exerting a combined pressure greater than about forty-four PSI (e.g., fifty PSI) on resilient member 37.

The above numbers are representative only and thus not meant to limit the invention. Specifically, additional combinations are possible depending on the overall system requirements.

To determine the appropriate number of compressible elements and corresponding characteristics for member 21, a review of the sizes of the contact area (field), the total number of contacts required (and their individual spacing), the necessary contact pressure (or force) required, and the actuation tolerance allowed is made. Applying this information, the contact area is divided into a grid and a determination made of the number of spaces required along the X and Y axis with each such space designed to accommodate one of the compressible elements 33. Each element is thus designed to provide the defined force for the corresponding plurality of contacts within the defined field. From this number of contacts and the required contact normal force, the total force for each element is determined. From the data of the preferred material for the invention (as defined hereinbelow, and having an preferred operating range at about twenty percent to thirty percent compression), including the defined system tolerance, the overall height and compressive distance for each element 33 is ascertained. Knowing the aforementioned information, the equation below, derived from a curve fit and transformations of the below-defined material data (i.e., at twenty-five percent compression), is employed:

Element Force = $R^2$ (120.5 $R/H$ + 430), wherein element force is the required force (pounds), R is the radius of the cylindrical element (inches) and H is the height thereof (inches). From this formula, the element radius (R) is determined. From this result, and knowing the desired element spacing, size, applied force and the assumed or allowed deflection, the overall size for the force distribution base plate 31 is determined. This is essentially a strength of material solution, depending on the desired material (e.g., aluminum or steel) for plate 31, and can be determined using known beam formulations or the like. The size of the resilient, elevation-compensating member 37 can be determined next by applying a predetermined out-of-flat tolerance (e.g., twenty-five percent) of this member's overall thickness.

Figure 9:
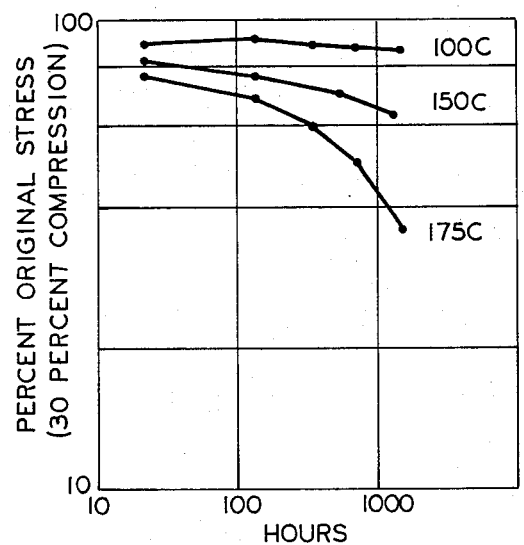
FIG. 9 is a graph illustrating compressive stress measurements over time and at different temperature levels for compressible elements comprised of a preferred material (silicone rubber), as taught herein, said elements being measured at approximately thirty (30) percent compression.

As stated, proper selection of an appropriate resilient material for the invention's compressible elements 33 is essential to achieve the desired results of long term stress retention, relatively low magnitude pressure (as defined herein), and operability at relatively high temperatures and humidity. A preferred material selected for use in the instant invention is a low compression set polysiloxane rubber available from the DOW Corning Corporation and sold under the name Silastic LCS-745U (Silastic is a registered trademark of the Dow Corning Corporation). This clean, low modulous elastomer demonstrates a seventy-five to eight-five percent retention of residual compressive stress when loaded in constant deflection at an elevated temperature (e.g., 100° C.) for a prolonged period. These results, in addition to those obtained for other measurements taken at different temperatures, are further illustrated in FIG. 9. FIG. 9 represents this data as obtained from cylindrical compressible elements possessing the aforementioned dimensions and compressed at about thirty percent of original height.

The aforementioned silicone rubber used for each of the compressible elements 33 is available from the Dow Corning Corporation in stock form. After being press vulcanized, such parts are serviceable (operable) over a temperature range of from about −73° Celsius (C.) to +250° C. and possess the highly desired features of good reversion (heat resistance), low compression set and good resistance to hot oils, water and steam. The described silicone rubber, as molded, possesses a durometer hardness (Shore A) of 52, a tensile strength of about 830 pounds per square inch and an elongation of about 260 percent.

Figure 5:
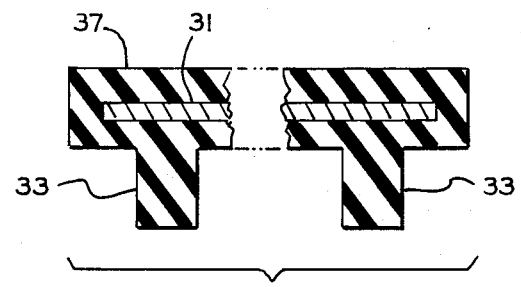
FIG. 5 is a side elevational view, in section, of a pressure exertion member in accordance with another embodiment of the invention.

In the embodiment of FIG. 3, each silicone rubber element 33 is shown as being attached to the aluminum base plate 31 (e.g., using a suitable (e.g., silicone based) adhesive). Alternatively, elements 33 and the invention's resilient member 37 may be vulcanized to plate 31 during molding. This alternative embodiment is shown in FIG. 5. The preferred resilient material for member 37 in FIG. 3 is also the aforementioned silicon rubber, said material being attached to the other side of plate 31 using the aforementioned adhesive. In the embodiment depicted in FIG. 5, both elements 33 and member 37 are of the same material (preferably silicone rubber) and molded as one integral unit which encases the aluminum plate 31. It is also within the scope of the invention to attach member 33 to plate 31, as described above, and thereafter mold resilient member 37 about the plate and attached members. The total encasement of plate 31 as shown in FIG. 5 is desirable from an operational and/or manufacturing standpoint.

In FIG. 7 there is shown an alternate embodiment for the conductors for use with first circuit member 13. Specifically, these conductors are illustrated as comprising metallic pins 71, each including a head portion 73 to which contact is made with the corresponding conductor from the flexible substrate 17 and a protruding portion 75 which extends within the insulative substrate 23 (e.g., to make contact with respective internal or external circuit path 77). The head portion 73 of each pin may be of substantially flat configuration (as shown) to thus provide a similar shape to that of the "metallic pads" described above. Other configurations for head portion 73 are also possible including those having protrusions, etc. The preferred metallic material for each pin 71 is copper or an alloy thereof (e.g., beryllium copper or phosphor bronze).

Figure 8:
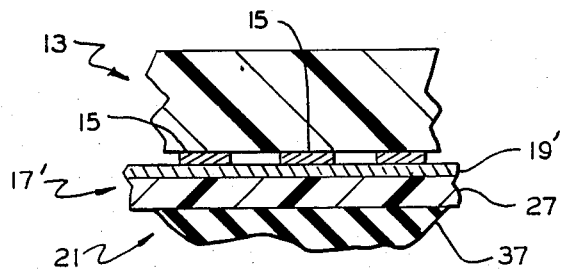
FIG. 8 is a partial view, in section, illustrating another embodiment of a second circuit member capable of being used in the instant invention, said second circuit member having a singular conductor adapted for simultaneously contacting the plurality of electrical conductors of the first circuit member.

In FIG. 8, these is shown an alternate embodiment of the invention wherein the described second circuit member 17' includes but a singular, elongated electrical conductor 19' as opposed to individual conductors as illustrated in the embodiment of FIGS. 1 and 2. The embodiment of FIG. 8 provides for electrical connection between the individual conductors 15 of a first circuit member such as described herein with a common, singular conductive path (e.g., ground). As in the embodiment of FIG. 1, the insulative (e.g., polyimide) substrate 27 of the flexible circuit 17' may be attached (e.g., using a suitable adhesive) to the outer surface of resilient member 37. Singular conductor 19' may be of known conductive material (e.g., copper, chrome-copper-chrome) and formed on substrate 27 using technique known in the art. In the embodiment of FIG. 8, member 21 serves to exert its combined force against the singular conductor to assure contact with each of the defined metallic pads 15.

Thus there has been shown and described an electrical connector assembly wherein sound effective contact is made between pluralities of electrical conductors therein using a pressure exertion member which includes as part thereof a plurality of compressible, silicone rubber elements able to withstand relatively high temperatures and adverse operating conditions to still assure an effective, low magnitude, uniform predetermined pressure. This is achieved by the invention in a facile, relatively inexpensive manner. The defined preferred silicone rubber material is a molded elastomer, and is also readily adaptable for use as the resilient portion of the invention's pressure exertion member to even further facilitate assembly and operation of the invention. As understood herein, it is also within the scope of the invention to employ more than one exertion member in combination with singular, significantly larger first and/or second circuit members, to thus comprise a larger overall structure wherein several conductor members are connected. It is even further within the scope of the invention to utilize such exertion members in such a larger, overall structure wherein circuit members of several different types are employed.

While there have been shown and described what are at present considered the preferred embodiments of the invention, it will be obvious to those skilled in the art that various changes and modifications may be made therein without departing from the scope of invention defined by the appended claims. For example, it is also possible to utilize a material other than aluminum as the invention's base plate (31). Other possible materials include plastic and steel.

What is claimed is:

1. An electrical connector assembly comprising:
    a first circuit member including a plurality of electrical conductors;
    a second circuit member including a plurality of electrical conductors;
    a pressure exertion member for exerting a predetermined pressure against said second circuit member to cause each of said electrical conductors of said second circuit member to electrical contact a respective one of said electrical conductors of said first circuit member, said pressure exertion member including a substantially rigid base plate, a plurality of compressible elements located on a first side of said base plate for providing said predetermined pressure when compressed, and a resilient member located on a second side of said base plate for compensating for variations in surface elevations in said first and/or second circuit members during exertion of said predetermined pressure against said second circuit member; and
    means for retaining said pressure exertion member against said second circuit member to cause said compression of said compressible elements and said exertion of said predetermined pressure.

2. The electrical connector assembly according to claim 1 wherein said first circuit member includes a substantially rigid substrate, said plurality of said electrical conductors of said first circuit member being located on said substrate.

3. The electrical connector assembly according to claim 2 wherein each of said electrical conductors of said first circuit member comprises a metallic pad.

4. The electrical connector assembly according to claim 2 wherein each of said electrical conductors of said first circuit member comprises a conductive pin having a portion thereof positioned within said substantially rigid substrate.

5. The electrical connector assembly according to claim 1 wherein said second circuit member comprises a flexible substrate, each of said electrical conductors of said second circuit member being located on said flexible substrate.

6. The electrical connector assembly according to claim 5 wherein each of said electrical conductors of said second cirucit member comprises a metallic pad.

7. The electrical connector assembly according to claim 1 wherein said pressure exertion member sustantially distributes thereacross the pressure exerted by each of said compressible elements, said compressible elements exerting said pressure against said base plate when said elements are compressed.

8. The electrical connector assembly according to claim 7 wherein said base plate is comprised of aluminum.

9. The electrical connector assembly according to claim 1 wherein said compressible elements are spacedly located on said first side of said base plate.

10. The electrical connector assembly according to claim 1 wherein each of said compressible elements is comprised of a resilient, electrically insulative material.

11. The electrical connector assembly according to claim 10 wherein said resilient, electrically insulative material is silicone rubber.

12. The electrical connector assembly according to claim 10 wherein each of said compressible elements is of substantially cylindrical configuration.

13. The electrical connector assembly according to claim 10 wherein said predetermined pressure provided by said compressible elements is within the range of from about ten to about fifty pounds per square inch.

14. The electrical connector assembly according to claim 13 wherein said compressible elements provide said pressure when compressed within the range of from about fifteen to about thirty-five percent of the original height thereof.

15. The electrical connector assembly according to claim 10 further including a housing member, each of said compressible elements located on said base plate being positioned within said housing.

16. The electrical connector assembly according to claim 15 wherein said housing including a plurality of apertures therein, each of said compressible elements being positioned within a respective one of said apertures within said housing.

17. The electrical connector assembly according to claim 16 wherein each of said apertures is substantially larger then each respective compressible element when said elements are in a non-compressed state, said elements substantially totally occupying said respective apertures when compressed.

18. The electrical connector assembly according to claim 15 wherein said means for retaining said pressure exertion member against said second circuit member comprises clamping means engagaing said housing member and said first circuit member to clamp said second circuit member therebetween.

19. An electrical connector assembly comprising:
  a first circuit member including a plurality of electrical conductors;
  a second circuit member including a singular, elongated electrical conductor;
  a pressure exertion member for exerting a predetermined pressure against said second circuit member to cause said elongated electrical conductor of said second circuit member to electrically contact each one of said electrical conductors of said first circuit member, said pressure exertion member including a substantially rigid base plate, a plurality of compressible elements located on a first side of said base plate for providing said predetermined pressure when compressed, and a resilient member located on a second side of said base plate for compensating for variations in surface elevations in said first and/or second circuit members during exertion of said predetermined pressure against said second circuit member; and
  means for retaining said pressure exertion member against said second circuit member to cause said compression of said compressible elements and said exertion of said predetermined pressure.

20. The electrical connector assembly according to claim 19 wherein said second circuit member comprises a flexible substrate, said singular, elongated electrical conductor being located on said flexible substrate.

* * * * *